(12) United States Patent
Liu et al.

(10) Patent No.: US 12,308,295 B2
(45) Date of Patent: May 20, 2025

(54) METHOD FOR OBTAINING PARAMETERS OF SEMICONDUCTOR STRUCTURE, METHOD FOR OBTAINING DETECTION STANDARD AND DETECTION METHOD

(71) Applicant: CHANGXIN MEMORY TECHNOLOGIES, INC., Hefei (CN)

(72) Inventors: Xinran Liu, Hefei (CN); Chunyang Wang, Hefei (CN); Changli Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 706 days.

(21) Appl. No.: 17/504,587

(22) Filed: Oct. 19, 2021

(65) Prior Publication Data

US 2022/0238393 A1    Jul. 28, 2022

Related U.S. Application Data

(63) Continuation of application No. PCT/CN2021/106484, filed on Jul. 15, 2021.

(30) Foreign Application Priority Data

Jan. 25, 2021 (CN) .......................... 202110097233.8

(51) Int. Cl.
*H01L 21/66* (2006.01)
(52) U.S. Cl.
CPC .................................... *H01L 22/20* (2013.01)
(58) Field of Classification Search
CPC ......... H01L 22/20; H01L 28/90; H01L 22/12; H10B 12/033
See application file for complete search history.

(56) References Cited

U.S. PATENT DOCUMENTS

| | | | |
|---|---|---|---|
| 9,466,466 B1 * | 10/2016 | Zhong | H01J 37/3299 |
| 2007/0111341 A1 | 5/2007 | Lin | |
| 2013/0010100 A1 * | 1/2013 | Kotaki | H01L 22/12 |
| | | | 348/80 |

FOREIGN PATENT DOCUMENTS

| | | |
|---|---|---|
| CN | 103390569 A | 11/2013 |
| CN | 203850292 U | 9/2014 |

(Continued)

OTHER PUBLICATIONS

Liang et al., Integrated Approach to Improving Local CD Uniformity in EUV Patterning, Extreme Ultraviolet (EUV) Lithography VIII, edited by Eric M. Panning, Kenneth A. Goldberg, Proc. of SPIE vol. 10143, 1014319, 2017 (Year: 2017).*

(Continued)

*Primary Examiner* — Daniel R Miller
(74) *Attorney, Agent, or Firm* — Kilpatrick Townsend & Stockton LLP

(57) ABSTRACT

Embodiments of the present disclosure provide a method for obtaining parameters of a semiconductor structure, a method for obtaining a detection standard and a detection method. The method for obtaining parameters of a semiconductor structure includes: obtaining a semiconductor structure, the semiconductor structure including a substrate and a capacitor support structure on the substrate, the capacitor support structure having a plurality of capacitor holes therein, the capacitor holes penetrating the capacitor support structure in a thickness direction of the capacitor support structure; removing some height of the capacitor support structure; obtaining a test pattern, the test pattern being a pattern exposed at a top of the remaining capacitor support structure; and in the test pattern, obtaining a spacing between the capacitor holes at predetermined positions on the basis of a predetermined direction.

18 Claims, 7 Drawing Sheets

(56) References Cited

FOREIGN PATENT DOCUMENTS

| | | |
|---|---|---|
| CN | 105895621 A | 8/2016 |
| CN | 112908881 A | 6/2021 |
| WO | WO-2006120722 A1 * | 11/2006 ............. H01L 22/12 |

OTHER PUBLICATIONS

Kim et al., Challenges in High Aspect Ratio Contact (HARC) Etching for DRAM Capacitor Formation, Advanced Etch Technology for Nanopatterning IV, edited by Qinghuang Lin, Sebastian U. Engelmann, Proc. of SPIE vol. 9428, 942806, 2015 (Year: 2014).*
ISR for International Application PCT/CN2021/106484 mailed Oct. 28, 2021.
Written Opinion for International Application PCT/CN2021/106484 mailed Oct. 28, 2021.

* cited by examiner

METHOD FOR OBTAINING PARAMETERS OF SEMICONDUCTOR STRUCTURE, METHOD FOR OBTAINING DETECTION STANDARD AND DETECTION METHOD

CROSS-REFERENCE TO RELATED APPLICATIONS

This application is a continuation of International Patent Application No. PCT/CN2021/106484 filed on Jul. 15, 2021, which claims priority to Chinese Patent Application No. 202110097233.8 filed on Jan. 25, 2021. The above-referenced applications are incorporated herein by reference in their entirety.

TECHNICAL FIELD

The present disclosure relates to the field of semiconductor manufacturing, and in particular to a method for obtaining parameters of a semiconductor structure, a method for obtaining a detection standard and a detection method.

BACKGROUND

A DRAM (Dynamic Random Access Memory) stores data by storing charges in a capacitor structure. The larger an aspect ratio of the formed capacitor structure, the larger a capacitance of the capacitor structure, and the more charges that can be stored.

Due to technological progress, a critical dimension of the DRAM is getting smaller and smaller and it is becoming more and more difficult to etch a capacitor structure with a high aspect ratio. In the process of forming a capacitor structure with a high aspect ratio, etching defects will be formed, which will lead to failure of part of the formed capacitor structure and affect the yield of semiconductor devices.

Traditional measurement processes are usually to conduct probe testing on wafer products, and it is difficult to find product problems in time, leading to yield problems in a large number of online products. How to quickly and accurately monitor abnormalities of a product is a problem that needs to be solved urgently.

SUMMARY

Embodiments of the present disclosure provide a method for obtaining parameters of a semiconductor structure, a method for obtaining a detection standard and a detection method and are intended to provide a method for quickly and accurately monitoring abnormalities of a product.

An embodiment of the present disclosure provides a method for obtaining parameters of a semiconductor structure, including: obtaining a semiconductor structure, the semiconductor structure including a substrate and a capacitor support structure on the substrate, the capacitor support structure having a plurality of capacitor holes therein, the capacitor holes penetrating the capacitor support structure in a thickness direction of the capacitor support structure; removing some height of the capacitor support structure; obtaining a test pattern, the test pattern being a pattern exposed at a top of the remaining capacitor support structure; and in the test pattern, obtaining a spacing between capacitor holes at predetermined positions on the basis of a predetermined direction.

An embodiment of the present disclosure further provides a method for obtaining a detection standard, according to the foregoing method for obtaining parameters of a semiconductor structure, further including: obtaining a yield of products corresponding to the semiconductor structure; and at the yield, obtaining a first test relationship between a height of the capacitor support structure removed from the semiconductor structure and a spacing between capacitor holes at predetermined positions.

An embodiment of the present disclosure further provides a detection method, according to the foregoing method for obtaining a detection standard, including: obtaining a semiconductor structure, the semiconductor structure including a substrate and a capacitor support structure on the substrate, the capacitor support structure having a plurality of capacitor holes therein, the capacitor holes penetrating the capacitor support structure in a thickness direction of the capacitor support structure; obtaining a set height and removing the set height of the capacitor support structure; obtaining a test pattern and an offset distance; according to a predetermined yield, obtaining a first test relationship corresponding to the predetermined yield; according to the first test relationship, obtaining a first determination standard for the offset distance after the set height of the capacitor support structure is removed; and according to the offset distance and the first determination standard, determining whether the semiconductor structure is in a normal etching state.

BRIEF DESCRIPTION OF DRAWINGS

One or more embodiments are illustrated in an exemplary manner by pictures in the corresponding drawings, and unless otherwise stated, the pictures in the drawings do not constitute a scale limitation.

DESCRIPTION OF EMBODIMENTS

Traditional measurement processes are usually to conduct probe testing on wafer products, and it is difficult to find product problems in time, leading to yield problems in a large number of online products. How to quickly and accurately monitor abnormalities of a product is a problem that needs to be solved urgently.

To solve the above problem, an embodiment of the present disclosure provides a method for obtaining parameters of a semiconductor structure, including: obtaining a semiconductor structure, the semiconductor structure including a substrate and a capacitor support structure on the substrate, the capacitor support structure having a plurality of capacitor holes therein, the capacitor holes penetrating the capacitor support structure in a thickness direction of the capacitor support structure; removing some height of the capacitor support structure; obtaining a test pattern, the test pattern being a pattern exposed at a top of the remaining capacitor support structure; and in the test pattern, obtaining a spacing between the capacitor holes at predetermined positions on the basis of a predetermined direction.

In order to make the objectives, technical solutions, and advantages of the embodiments of the present disclosure more clear, various embodiments of the present disclosures will be detailed below in combination with the accompanying drawings. However, a person of ordinary skill in the art can understand that in each embodiment of the present disclosure, many technical details are provided for readers to better understand the present disclosure. However, even if these technical details are not provided and according to variations and modifications of the following embodiments, the technical solutions sought for protection in the present disclosure can also be implemented. The following various embodiments are distinguished for convenience of description, which should not constitute any limitation on the specific implementation manner of the present disclosure. The various embodiments may be combined with each other under the premise of no contradiction.

Figure 1:
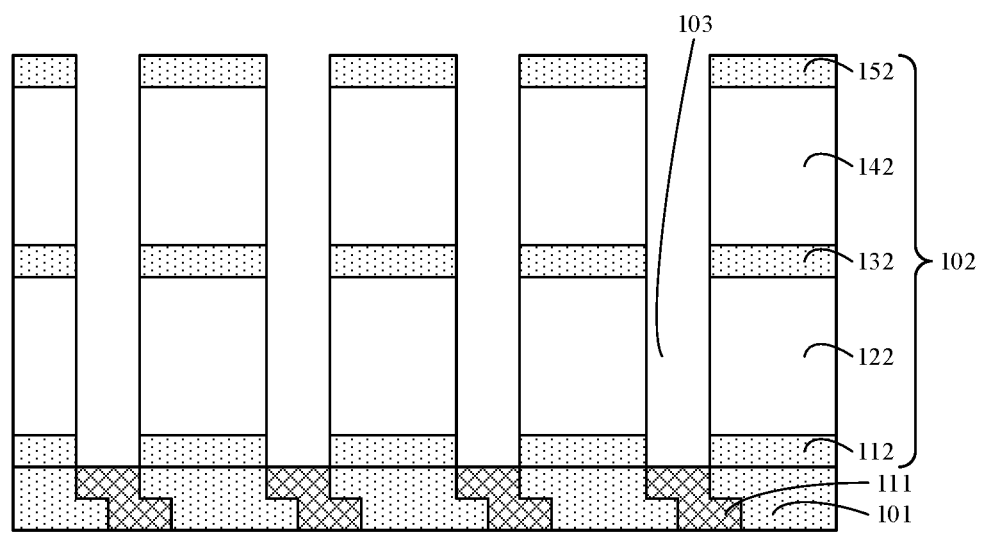
FIGS. 1 and 2 are schematic structural diagrams showing a semiconductor structure and a top pattern according to an embodiment of the present disclosure after etching under an ideal condition.
Figure 2:
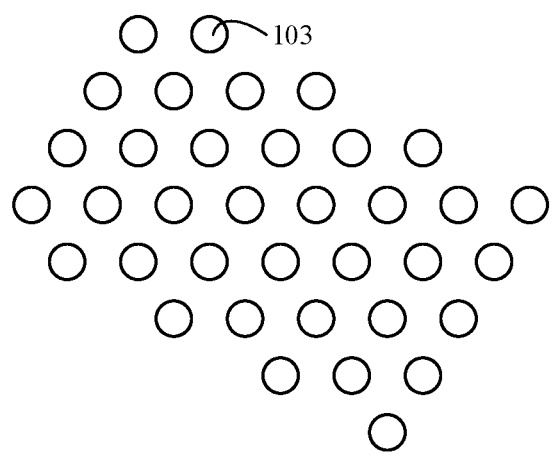
Figure 3:
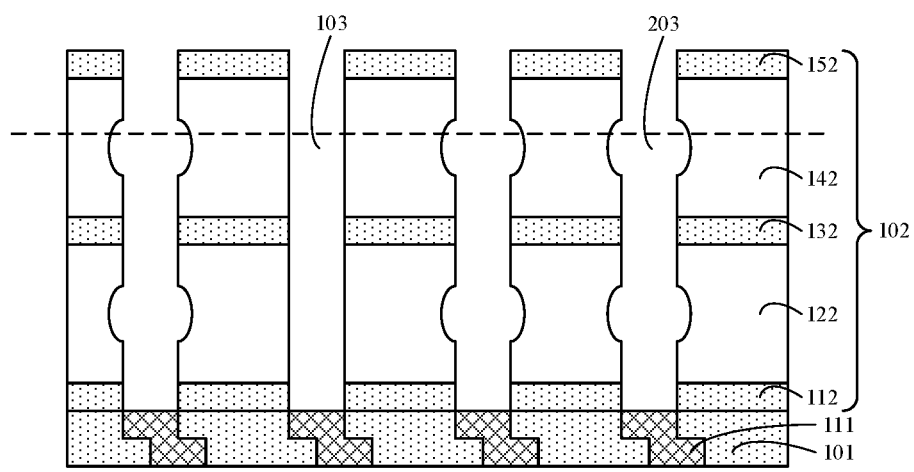
FIGS. 3 and 4 are schematic structural diagrams showing a semiconductor structure with etching defects of a first type and a pattern at a position indicated by a dotted line according to an embodiment of the present disclosure after etching.
Figure 4:
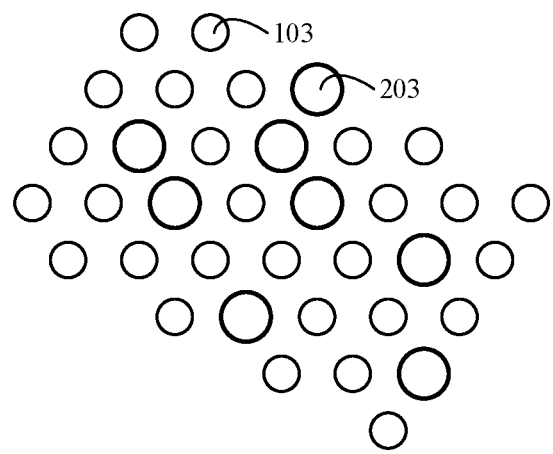
Figure 5:
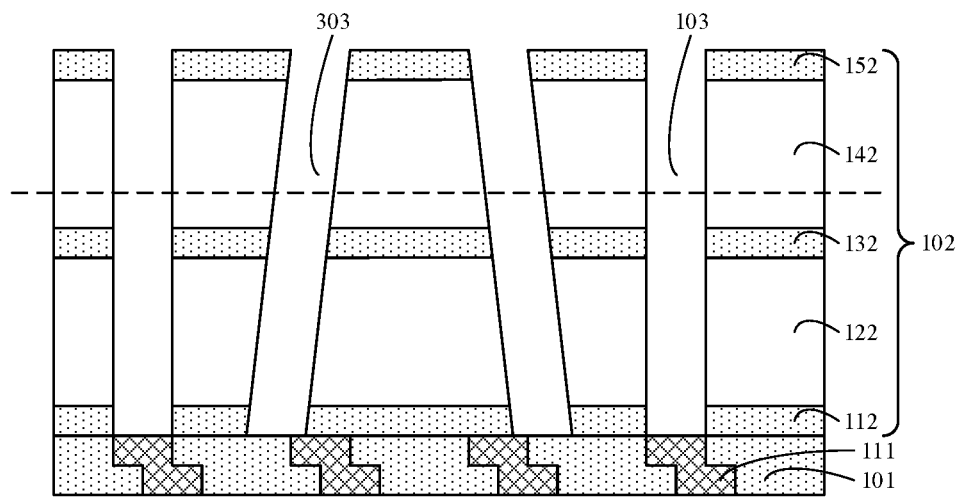
FIGS. 5 and 6 are schematic structural diagrams showing a semiconductor structure with etching defects of a second type and a pattern at a position indicated by a dotted line according to an embodiment of the present disclosure after etching.
Figure 6:
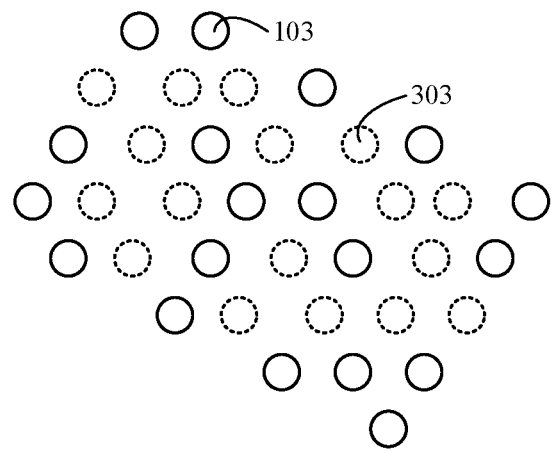

FIGS. 1 and 2 are schematic structural diagrams showing a semiconductor structure and a top pattern according to an embodiment of the present disclosure after etching under an ideal condition; FIGS. 3 and 4 are schematic structural diagrams showing a semiconductor structure with etching defects of a first type and a pattern at a position indicated by a dotted line according to an embodiment of the present disclosure after etching; and FIGS. 5 and 6 are schematic structural diagrams showing a semiconductor structure with etching defects of a second type and a pattern at a position indicated by a dotted line according to an embodiment of the present disclosure after etching. The detection principle of this embodiment will be described in detail below with reference to FIGS. 1 to 6, and the specific content of the detection principle is as follows.

Referring to FIG. 1, the semiconductor structure in this embodiment is subjected to an etching process and capacitor holes are formed. The semiconductor structure includes: a substrate 101 and a capacitor support structure 102 on the substrate 101, wherein substrate 101 includes a conductive layer 111 configured to be electrically connected with a capacitor structure subsequently formed on the basis of the capacitor hole 103; the capacitor support structure 102 includes a bottom support layer 112, a first sacrificial layer 122, a middle support layer 132, a second sacrificial layer 142, and a top support layer 152 which are sequentially stacked on the substrate 101; the capacitor support structure 102 has a plurality of capacitor holes 103 therein, and the capacitor holes 103 penetrate the capacitor support structure 102 in a thickness direction of the capacitor support structure 102. In this case, a top pattern of the capacitor support structure 102 refers to FIG. 2. The capacitor holes 103 are spaced by an equal distance. In the process of removing the predetermined height of the capacitor support structure 102, the top pattern of the remaining capacitor support structure 102 remains unchanged in shape.

Referring to FIG. 3, if the capacitor support structure 102 formed by etching has defect capacitor holes 203 of a first type, the defect capacitor holes 203 of the first type refer to defects caused when the first sacrificial layer 122 and the second sacrificial layer 132 are partially over-etched. The defect will affect the yield of subsequently formed wafer products. If the capacitor support structure 102 is etched to the dotted line, the top pattern of the remaining capacitor support structure 102 in this case refers to FIG. 4. The defect capacitor hole 203 of the first type is larger than the capacitor hole 103 in size. By detecting a dimensional change in the capacitor hole 103 in the process of etching some height of the capacitor support structure 102, a dimensional variation of the capacitor hole 103 can be obtained; then, a yield of wafer products corresponding to the semiconductor structure with defect capacitor holes 203 of the first type is obtained, and then an influence of the size of the defect capacitor hole 203 of the first type on the yield of wafer products corresponding to the semiconductor structure is obtained.

Referring to FIG. 5, if the capacitor support structure 102 formed by etching has defect capacitor holes 303 of a second type, the defect capacitor holes 303 of the second type will refer to such inclined capacitor holes 103 after the etching, and the defect capacitor holes 303 of the second type will affect a contact surface of the subsequently formed capacitor structure with the conductive layer 111, thereby affecting the yield of subsequently formed wafer products. If the capacitor support structure 102 is etched to the dotted line, the top pattern of the remaining capacitor support structure 102 in this case refers to FIG. 6. The defect capacitor hole 303 of the second type will have position offset. By detecting the offset of the defect capacitor hole 303 of the second type, the yield of wafer products corresponding to the semiconductor structure with the defect capacitor holes 303 of the second type is obtained, and then an influence of the offset of the defect capacitor hole 303 of the second type on the yield of wafer products corresponding to the semiconductor structure is obtained.

In addition, in addition to the defect capacitor hole 203 of the first type and the defect capacitor hole 303 of the second type, the semiconductor structure also has other capacitor hole defects therein, and all these defects will affect the yield of wafer products corresponding to the semiconductor structure, which will not be enumerated here one by one. However, the following methods can all be used to measure corresponding parameters of the defect capacitor hole 203 of the first type and the defect capacitor hole 303 of the second type, and solve the above-mentioned technical problem.

The method for obtaining parameters of a semiconductor structure according to this embodiment will be described in detail below with conjunction with the accompanying drawings.

Figure 7:
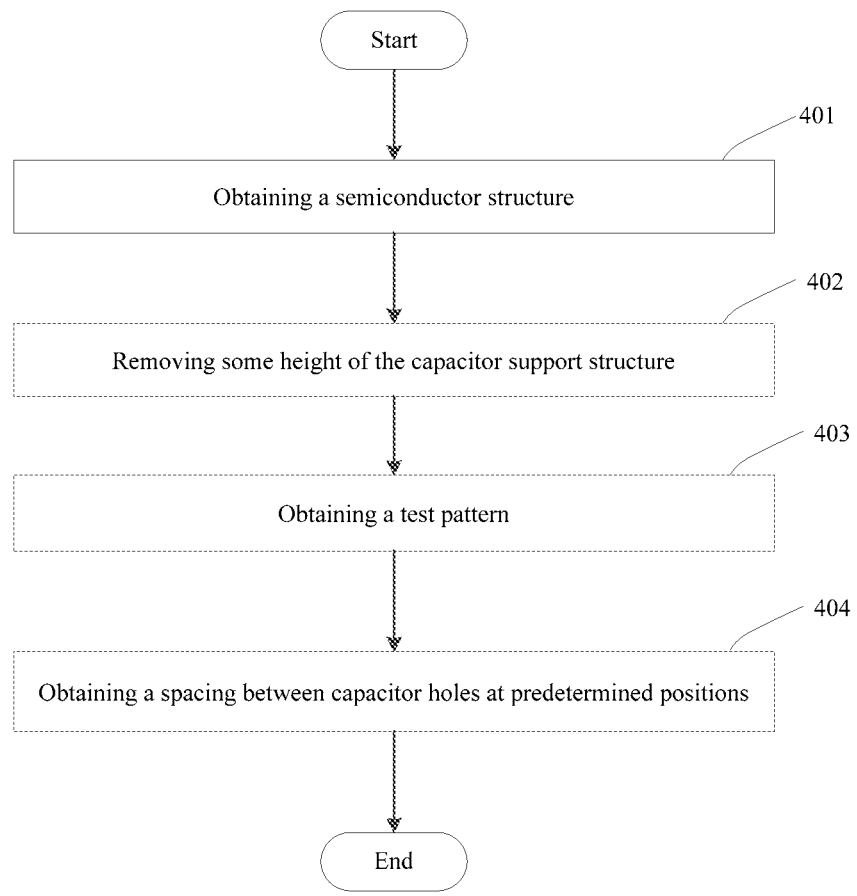
FIG. 7 is a schematic flowchart of obtaining parameters of a semiconductor structure according to an embodiment of the present disclosure.

Referring to FIG. 7, the method for obtaining parameters of a semiconductor structure includes the following steps.

In step 401, a semiconductor structure is obtained.

Specifically, the semiconductor structure subjected to an etching process is obtained from a production line. The semiconductor structure includes a substrate and a capacitor support structure on the substrate. The capacitor support structure has a plurality of capacitor holes, and the capacitor holes penetrate the capacitor support structure in a thickness direction of the capacitor support structure.

In step 402, some height of the capacitor support structure is removed.

Specifically, a predetermined height is set according to an application scenario. Those skilled in the art can understand that the larger the predetermined height, the more comprehensively a dimensional change in the capacitor hole in the removal of the capacitor support structure can be detected. In an example, referring to FIG. 1, only the top support layer 152 may be removed, or the top support layer 152 may be removed and then part of the second sacrificial layer 142 may be removed, or the capacitor support structure can be removed to the thickness of the middle support layer 132 or the first sacrificial layer 122.

In addition, depending on different predetermined heights set, the thickness of the removed capacitor support structure is different. In this case, the offset of the defect capacitor hole of the second type will increase, that is, there is a difference in the correspondence between the offset of the capacitor hole and the yield of wafer products corresponding to the semiconductor structure.

It should be noted that the predetermined height may be of multiple height values. Specifically, the multiple predetermined heights are sorted from smallest to largest, and the capacitor support structure is etched to the predetermined heights in sequence to obtain a relationship between the offset of the defect capacitor hole of the second type and the yield of wafer products corresponding to the semiconductor structure, thus obtaining a relationship between the offset of the capacitor hole of the second type and the yield of wafer products corresponding to the semiconductor structure at different predetermined heights in an etching process.

In step 403, a test pattern is obtained.

Specifically, the test pattern is obtained, and the test pattern is a pattern exposed at the top of the remaining capacitor support structure. The test pattern is used to reflect positions of the capacitor holes in the remaining capacitor support structure, which is convenient for obtaining the dimensional variation of the capacitor hole and measuring a spacing between the capacitor holes at predetermined positions.

In step 404, a spacing between the capacitor holes at predetermined positions is obtained.

Specifically, in the test pattern, the spacing between the capacitor holes at the predetermined positions is obtained on the basis of a predetermined direction.

The spacing between the capacitor holes at the predetermined positions can be a spacing between adjacent capacitor holes, a spacing between every three capacitor holes, a spacing between every four capacitor holes, and the like, or a spacing between the capacitor holes at specified positions. In this embodiment, the spacing between adjacent capacitor holes is used as the spacing between the capacitor holes at the predetermined positions.

In this embodiment, the obtaining the spacing between the capacitor holes at the predetermined positions on the basis of the predetermined direction includes: in the test pattern, obtaining an offset distance of the capacitor hole at the predetermined position on the basis of the predetermined direction.

Specifically, the offset distance is used to represent a position offset of the capacitor hole.

Figure 8:
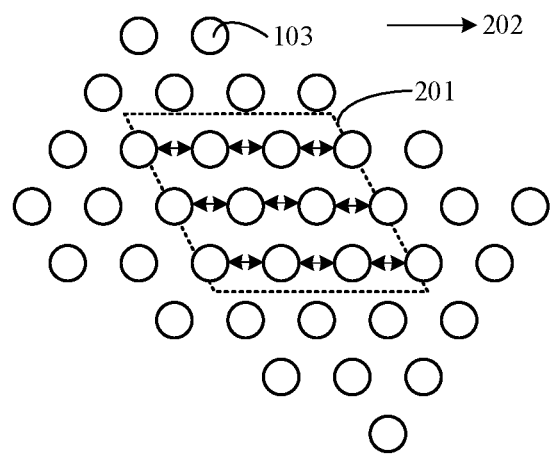
FIG. 8 is a schematic structural diagram of determining a measurement interval according to an embodiment of the present disclosure.

In this embodiment, the process of obtaining the offset distance of the capacitor hole at the predetermined position on the basis of the predetermined direction includes the following steps:

referring to FIG. 8, determining a measurement interval 201 in the test pattern, the measurement interval 201 including capacitor holes 103 in M rows and N columns, M and N being natural numbers greater than or equal to 2; obtaining a spacing between adjacent capacitance holes 103 in the measurement interval 201; obtaining an offset range according to maximum and minimum ones of multiple spacings in a single row/column on the basis of the predetermined direction, the offset range indicating a distance between the maximum and minimum ones of the spacings; and obtaining an offset distance, the offset distance indicating an average of multiple offset ranges.

It should be noted that M and N can be a same natural number, that is, M=N; M and N can also be unequal natural numbers, that is, WN. In this embodiment, as shown in FIG. 8, the measurement interval 201 includes capacitor holes in 3 rows and 3 columns, an arrow 202 points to the predetermined direction; multiple spacings between the capacitor holes 103 are obtained in the predetermined direction, and according to the obtained multiple spacings, the maximum and minimum ones of the multiple spacings in a single row/column are obtained; an offset range in a single row/column is obtained according to a difference between the maximum spacing and the minimum spacing; and then an offset distance is obtained according to an average of the offset range of each column or each row, and the offset distance is used to represent a position offset of the capacitance hole in the measurement interval 201. In other embodiments, an interval where WN may also be used as the measurement interval, and this embodiment does not constitute a limitation on the size of the measurement interval.

In this embodiment, the spacing between the capacitor holes 103 is obtained by a CD-SEM (Critical Dimension Scanning Electron Microscope), and the spacing between the capacitor holes 103 can be accurately and quickly obtained by the CD-SEM.

It should be noted that in FIG. 8, a row direction is used as the predetermined direction to obtain the offset range of each row and thus the offset distance in the measurement interval 201 is obtained accordingly. In other embodiments, a column direction may be used as the predetermined direction to obtain the offset range of each column and thus the offset distance in the measurement interval can be obtained accordingly; the column direction and the row direction may be both used as the predetermined direction to obtain the offset range of each column and the offset range of each row and thus the offset distance in the measurement interval can be obtained accordingly; according to the combination of the row direction and the column direction and according to the offset range of each row and the offset range of each column, the offset distance of the capacitor hole can be obtained more comprehensively.

Figure 9:
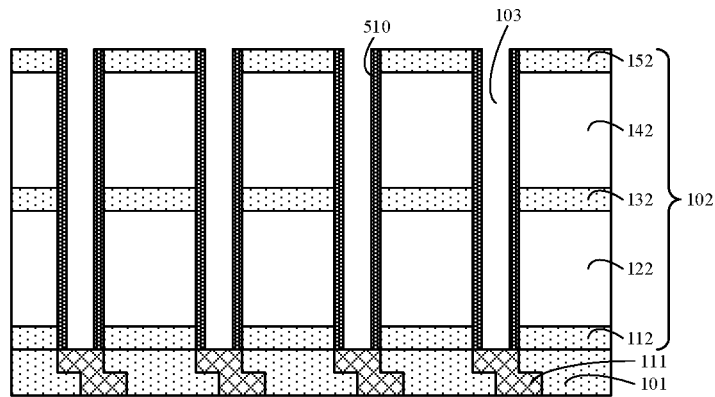
FIG. 9 is a schematic structural diagram of a semiconductor structure in a method for obtaining parameters of a semiconductor structure according to an embodiment of the present disclosure.

Referring to FIG. 9, in this embodiment, before step 502, the method further includes: forming a protective layer 510 on sidewalls of the capacitor hole 103. By forming the protective layer 510 on the sidewall of the capacitor hole 103, the capacitor hole 103 can be prevented from damage during the process of transferring the top pattern of the capacitor support structure 102 downward; and forming the protective layer 510 on the sidewalls of the capacitor hole 103 includes the following steps:

forming a protective film (not shown) covering both a top surface of the capacitor support structure and the sidewalls of the capacitor hole, and removing the protective film (not shown) on a surface of the capacitor support structure 102 to form the protective layer 510 on the sidewalls of the capacitor hole 103.

In an example, the protective layer 510 is made of at least one of SiN, SiON, and TiN. In this embodiment, the protective layer 510 is made of SiN.

In this embodiment, the process of removing some height of the capacitor support structure includes: obtaining a dimensional variation of the capacitor hole in the pattern exposed at the top of the capacitor support structure, the dimensional variation being used to represent a value of a dimensional change in the capacitor hole in the process of removing some height of the capacitor support structure.

It should be noted that the dimensional variation can be obtained on a timed basis or in real time. If the dimensional variation is obtained on a timed basis, in the process of etching to a predetermined height, multiple top patterns of the remaining capacitor support structure are obtained, and then the dimensional variation of each capacitor hole is obtained according to the multiple top patterns of the remaining capacitor support structures. If the dimensional variation is obtained on a timed basis, in the process of etching to a predetermined height, a sensor is used to obtain dimensions of the capacitor holes in the top pattern of the remaining capacitor support structure in real time until the capacitor support structure is etched to the predetermined height, and then the dimensional variation of each capacitor hole is obtained.

Specifically, the process of obtaining the dimensional variation of the capacitor hole in the pattern exposed at the top of the capacitor support structure includes the following steps: according to a dimension of each capacitor hole in the semiconductor structure, obtaining a maximum value of a dimensional change in each capacitor hole in the process of removing some height of the capacitor support structure; and according to the maximum value of the dimensional change in the capacitor hole, obtaining the dimensional variation, the dimensional variation being an average of the multiple maximum values of the dimension change in the capacitor holes.

Compared with a related art, the present disclosure adopts a solution that by removing some height of the capacitor support structure, the top pattern of the semiconductor structure is transferred downward to obtain the test pattern and the spacing between the capacitor holes in the test pattern is obtained, so as to quickly obtain parameters of the capacitance hole in the product after etching.

The division of the above various steps is only for clear description. In implementation, the steps can be combined into one step or some steps can be split into a plurality steps, as long as they include the same logical relationship, they are all within the protection scope of this patent. Insignificant modifications added to the process or insignificant designs introduced to the process without changing the core design of the process are all within the protection scope of this patent.

Another embodiment of the present disclosure relates to a method for obtaining a detection standard, according to the foregoing method for obtaining parameters of a semiconductor structure, further including: obtaining a yield of products corresponding to the semiconductor structure; and at the yield, obtaining a first test relationship between a height of the capacitor support structure removed from the semiconductor structure and a spacing between capacitor holes at predetermined positions.

Figure 10:
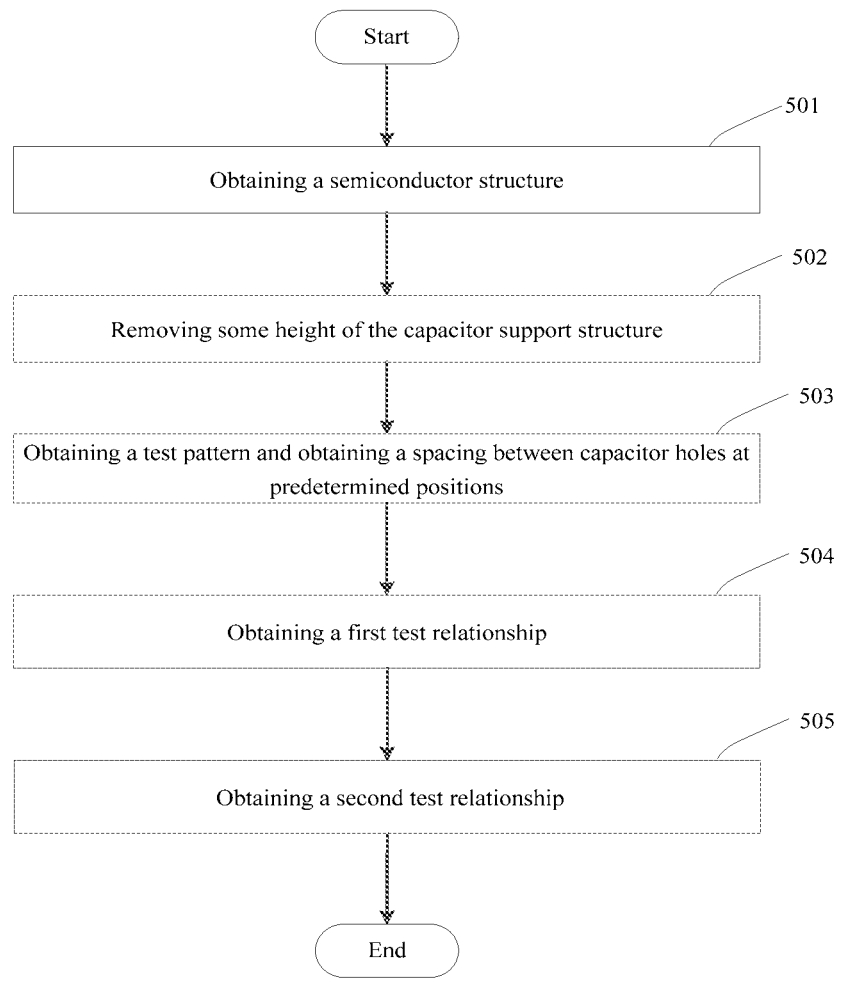
FIG. 10 is a schematic flowchart of a method of obtaining a detection standard according to another embodiment of the present disclosure.

FIG. 10 is a schematic flowchart of the method for obtaining a detection standard according to this embodiment. The detection method of this embodiment will be described in detail below with reference to the accompanying drawings. The parts same as or corresponding to the foregoing embodiment will not be described in detail below.

Referring to FIG. 10, illustrated is a method for obtaining a detection standard, including the following steps.

In step 501, a semiconductor structure is obtained.

Specifically, the semiconductor structure subjected to an etching process is obtained from a production line. The semiconductor structure includes a substrate and a capacitor support structure on the substrate. The capacitor support structure has a plurality of capacitor holes, and the capacitor holes penetrate the capacitor support structure in a thickness direction of the capacitor support structure.

In step 502, some height of the capacitor support structure is removed.

Specifically, a predetermined height is set according to an application scenario. Those skilled in the art can understand that the larger the predetermined height, the more comprehensively a dimensional change in the capacitor hole in the removal of the capacitor support structure can be detected. In addition, depending on different predetermined heights set, the thickness of the removed capacitor support structure is different. In this case, the offset of the defect capacitor hole of the second type will increase, that is, there is a difference in the correspondence between the offset of the capacitor hole and the yield of wafer products corresponding to the semiconductor structure.

In step 503, a test pattern is obtained and a spacing between the capacitor holes at the predetermined positions is obtained.

Specifically, the test pattern is obtained, and the test pattern is a pattern exposed at the top of the remaining capacitor support structure. The test pattern is used to reflect positions of the capacitor holes in the remaining capacitor support structure, which is convenient for obtaining the dimensional variation of the capacitor hole and measuring a spacing between the capacitor holes at predetermined positions.

In step 504, a first test relationship is obtained.

Specifically, a yield of products corresponding to the semiconductor structure is obtained at first; and then at the yield, a first test relationship between a height of the capacitor support structure removed from the semiconductor structure and a spacing between capacitor holes at predetermined positions is obtained.

In this embodiment, the spacing between the capacitor holes at the predetermined positions is used as an offset distance, and the offset distance is used to represent a position offset of the capacitor hole. That is, the first test relationship refers to a relationship between the height of the removed capacitor support structure and the offset distance at the yield of products corresponding to the semiconductor structure.

In this case, after part of the capacitor support structure is removed from the semiconductor structure, when an actual offset distance of the capacitor hole of the semiconductor structure is not greater than a standard offset distance, it indicates that the yield corresponding to the semiconductor structure meets a predetermined yield standard. After part of the capacitor support structure is removed from the semiconductor structure, when the actual offset distance of the capacitor hole of the semiconductor structure is greater than the standard offset distance, it indicates that the yield corresponding to the semiconductor structure does not meet the predetermined yield standard.

In step 505, a second test relationship is obtained.

Specifically, the first test relationship of the semiconductor structure corresponding to products with different yields is obtained; and according to the first test relationship at different yields, a second test relationship is established among the height of the removed capacitor support structure, the spacing between the capacitor holes at the predetermined positions, and the yield.

In this embodiment, compared to the first test relationship, the second test relationship is used to correlate the height of the removed capacitor support structure, the offset distance, and the yield; and a range of the offset distance is obtained subsequently according to a required yield range and the height of the removed capacitor support structure, so as to accurately determine an etching state of the semiconductor structure.

In this embodiment, the process of removing some height of the capacitor support structure includes: obtaining a dimensional variation of the capacitor hole in the pattern exposed at the top of the capacitor support structure, the dimensional variation being used to represent a value of a dimensional change in the capacitor hole in the process of removing some height of the capacitor support structure; and at the yield of products corresponding to the semiconductor structure, obtaining a third test relationship between the height of the capacitor support structure removed from the semiconductor structure and the dimensional variation.

Specifically, since the semiconductor structure is obtained from a production line and subjected to an etching process, the yield of a batch of products corresponding to the semiconductor structure is obtained, and according to the obtained dimensional variation of the semiconductor structure, the third test relationship is obtained. The third test relationship is used to represent a relationship between the yield and the dimensional change. The standard dimensional variation of the capacitor hole is then obtained according to the predetermined yield standard and the height of the removed capacitor support structure.

In this case, after part of the capacitor support structure is removed from the semiconductor structure, when an actual dimensional variation of the capacitor hole of the semiconductor structure is not greater than a standard offset distance, it indicates that the yield corresponding to the semiconductor structure meets a predetermined yield standard. After part of the capacitor support structure is removed from the semiconductor structure, when the actual dimensional variation of the capacitor hole of the semiconductor structure is greater than the standard offset distance, it indicates that the yield corresponding to the semiconductor structure does not meet the predetermined yield standard.

In this embodiment, the method further includes: obtaining the third test relationship of the semiconductor structure corresponding to products with different yields; and according to the third test relationship at different predetermined yield standards, establishing a fourth test relationship among the height of the removed capacitor support structure, the dimensional variation, and the yield.

Compared to the third test relationship, the fourth test relationship is used to correlate the height of the removed capacitor support structure, the dimensional variation, and the yield; and a range of the dimensional variation is obtained subsequently according to a required yield range and the height of the removed capacitor support structure, so as to accurately determine an etching state of the semiconductor structure.

Compared with the related art, the present disclosure adopts a solution that the top pattern of the semiconductor structure is transferred downward to obtain the test pattern, the spacing between the capacitor holes in the test pattern is determined, a corresponding test relationship is obtained according to the yield of the batch corresponding to the semiconductor structure, and the yield of the semiconductor structure can be directly obtained subsequently according to the spacing between the capacitor holes, thus quickly monitoring the abnormality of the product.

The division of the above various steps is only for clear description. In implementation, the steps can be combined into one step or some steps can be split into a plurality steps, as long as they include the same logical relationship, they are all within the protection scope of this patent. Insignificant modifications added to the process or insignificant designs introduced to the process without changing the core design of the process are all within the protection scope of this patent.

Yet another embodiment of the present disclosure relates to a detection method, according to the obtaining method according to the above embodiment, including: obtaining a semiconductor structure, the semiconductor structure including a substrate and a capacitor support structure on the substrate, the capacitor support structure having a plurality of capacitor holes therein, the capacitor holes penetrating the capacitor support structure in a thickness direction of the capacitor support structure; obtaining a set height and removing the set height of the capacitor support structure; obtaining a test pattern and an offset distance; according to a predetermined yield, obtaining a first test relationship corresponding to the predetermined yield; according to the first test relationship, obtaining a first determination standard for the offset distance after the set height of the capacitor support structure is removed; and according to the offset distance and the first determination standard, determining whether the semiconductor structure is in a normal etching state.

Figure 11:
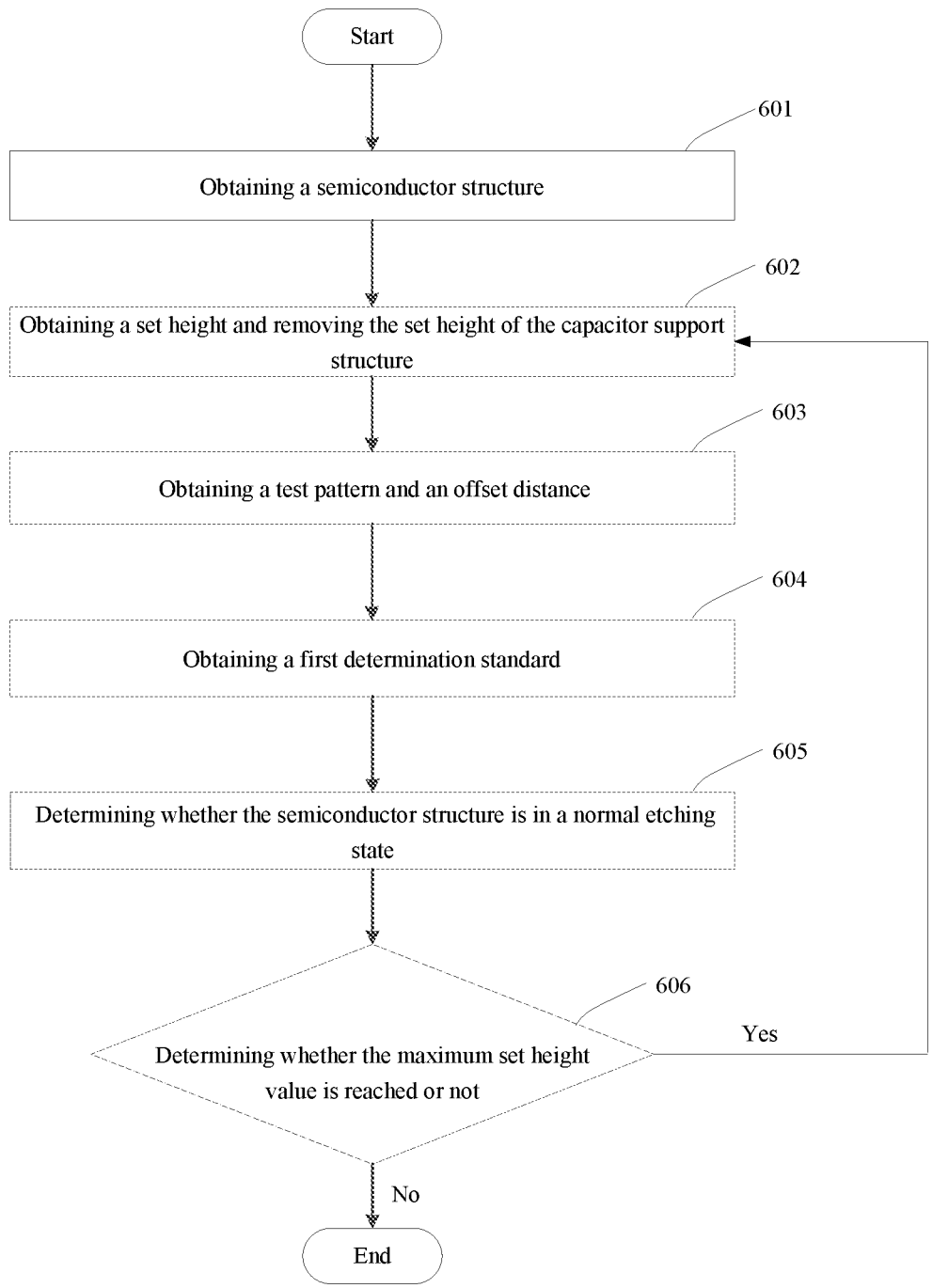
FIGS. 11 and 12 are schematic flowcharts of a detection method according to yet another embodiment of the present disclosure.
Figure 12:
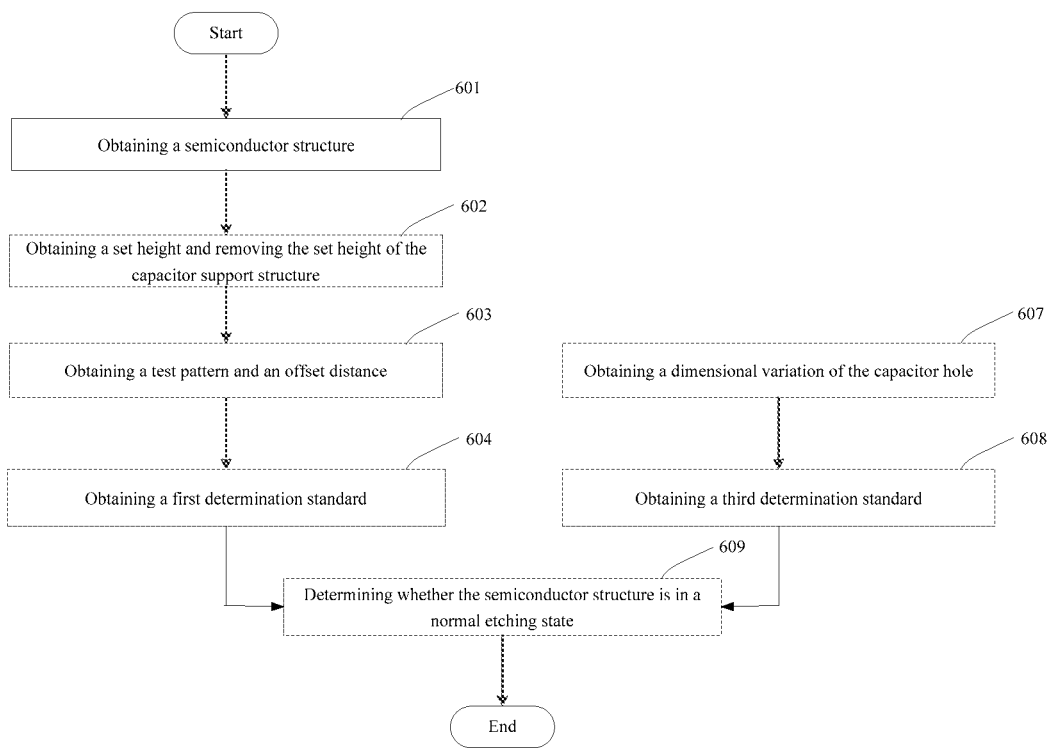

FIGS. 11 and 12 are schematic flowcharts of a detection method according to this embodiment. The detection method of this embodiment will be described in detail below with reference to the accompanying drawings. The parts same as or corresponding to the foregoing embodiment will not be described in detail below.

Referring to FIG. 11, illustrated is a detection method, including the following steps.

In step 601, a semiconductor structure is obtained.

Specifically, the semiconductor structure is obtained. The semiconductor structure includes a substrate and a capacitor support structure on the substrate. The capacitor support structure has a plurality of capacitor holes, and the capacitor holes penetrate the capacitor support structure in a thickness direction of the capacitor support structure.

In this embodiment, the semiconductor structure is obtained from the production line that completes an etching process, which can intuitively detect the yield of the semiconductor structure subjected to the etching process, thus quickly monitoring the abnormality of the product.

In step 602, a set height is obtained and the set height of the capacitor support structure is removed.

Specifically, the set height is set according to an application scenario. Those skilled in the art can understand that the larger the set height, the more comprehensively a dimensional change in the capacitor hole in the removal of the capacitor support structure can be detected. In addition, depending on different set heights, the thickness of the removed capacitor support structure is different. In this case, the offset of the defect capacitor hole of the second type will increase, that is, there is a difference in the correspondence between the offset of the capacitor hole and the yield of wafer products corresponding to the semiconductor structure.

In step 603, a test pattern and an offset distance are obtained.

Specifically, the test pattern is obtained, and the test pattern is a pattern exposed at the top of the remaining capacitor support structure. The test pattern is used to reflect positions of the capacitor holes in the remaining capacitor support structure, which is convenient for obtaining the dimensional variation of the capacitor hole and measuring a spacing between the capacitor holes at predetermined positions.

In the test pattern, the offset distance is obtained on the basis of a predetermined direction, and the offset distance is used to represent a position offset of the capacitor hole.

In this embodiment, the process of obtaining the offset distance on the basis of the predetermined direction includes the following steps:

referring to FIG. 8, determining a measurement interval 201 in the test pattern, the measurement interval 201 including the capacitor holes 103 in M rows and N columns, M and N being natural numbers greater than or equal to 2; obtaining a spacing between adjacent ones of the capacitance holes 103 in the measurement interval 201; obtaining an offset range according to maximum and minimum ones of the plurality of spacings in a single row/column in the predetermined direction, the offset range indicating a distance between the maximum and minimum ones of the spacings; and obtaining the offset distance, the offset distance indicating an average of the plurality of offset ranges.

In FIG. 8, the measurement interval 201 includes capacitor holes in 3 rows and 3 columns, an arrow 202 points to the predetermined direction; multiple spacings between the capacitor holes 103 are obtained in the predetermined direction, and according to the obtained multiple spacings, the maximum and minimum ones of the multiple spacings in a single row/column are obtained; an offset range in a single row/column is obtained according to a difference between the maximum spacing and the minimum spacing; and then an offset distance is obtained according to an average of the offset range of each column or each row, and the offset distance is used to represent a position offset of the capacitance hole in the measurement interval 201.

In step 604, a first determination standard is obtained.

According to the predetermined yield, a first test relationship corresponding to the predetermined yield is obtained; and according to the first test relationship, a first determination standard for the offset distance after the set height of the capacitor support structure is removed.

Specifically, the predetermined yield refers to a required yield of wafers corresponding to the semiconductor structure, and according to the predetermined yield and the set height, the corresponding offset distance is obtained as the first determination standard.

In step 605, whether the semiconductor structure is in a normal etching state is determined.

According to the offset distance and the first determination standard, whether the semiconductor structure is in a normal etching state is determined.

Specifically, it is determined whether an actual offset distance of the semiconductor structure is within a range of the first determination standard. If the actual offset distance of the semiconductor structure is less than or equal to the first determination standard, it indicates that the semiconductor structure is in a normal etching state. If the actual offset distance of the semiconductor structure is greater than the first determination standard, it indicates that the semiconductor structure is in an abnormal etching state.

In an example, after step 604 and before step 605, the detection method further includes: obtaining the first test relationship of the semiconductor structure corresponding to products with different yields; and according to the first test relationship at different yields, establishing a second test relationship among the height of the removed capacitor support structure, the spacing between the capacitor holes at the predetermined positions, and the yield.

The process of according to the first test relationship, obtaining the first determination standard for the offset distance when the set height of the capacitor support structure is removed includes: according to a predetermined yield range, obtaining a second test relationship corresponding to the predetermined yield range; and according to the second test relationship, obtaining a second determination standard for the offset distance after the set height of the capacitor support structure is removed.

Specifically, the yield range refers to the yield of the semiconductor structure in a normal working state confirmed according to an actual application; the offset distance corresponding to the yield range is obtained according to the set height, and a range of the offset distance is used as the second determination standard.

The process of according to the offset distance and the first determination standard, determining whether the semiconductor structure is in a normal etching state includes: according to the offset distance and the second determination standard, determining whether the semiconductor structure is in a normal etching state. That is, in this case, whether the semiconductor structure is in a normal etching state is determined according to the second determination standard in step 605.

Specifically, it is determined whether the actual offset distance of the semiconductor structure is within a range of the second determination standard. If the actual offset distance of the semiconductor structure reaches the second determination standard, it indicates that the semiconductor structure is in a normal etching state. If the actual offset distance of the semiconductor structure does not reach the second determination standard, it indicates that the semiconductor structure is in an abnormal etching state.

In this embodiment, after step 605, the detection method further includes step 606 to determine whether a maximum set height value is reached.

Specifically, the set height may be of multiple height values. The multiple height values are sorted, and in an order from smallest to largest, the etching state of the semiconductor structure at each set height is obtained. By setting the multiple height values, a relationship between the offset of the capacitor hole and the yield at different predetermined heights can be obtained in an etching process, thus more comprehensively monitoring whether the product is abnormal.

In this embodiment, referring to FIG. 12, step 607 and step 608 are further included, and step 607 and step 602 are executed simultaneously.

In step 607, a dimensional variation of the capacitor hole is obtained.

Specifically, a dimensional variation of the capacitor hole in a pattern exposed at the top of the capacitor support structure is obtained.

In an example, a maximum value of a dimensional change in each capacitor hole is obtained; and according to the maximum value of the dimensional change in the capacitor hole, the dimensional variation is obtained. The dimensional variation is an average of the multiple maximum values of the dimension change in the capacitor holes.

It should be noted that the dimensional variation can be obtained on a timed basis or in real time. If the dimensional variation is obtained on a timed basis, in the process of etching to a predetermined height, multiple top patterns of the remaining capacitor support structure are obtained, and then the dimensional variation of each capacitor hole is obtained according to the multiple top patterns of the remaining capacitor support structures. If the dimensional variation is obtained on a timed basis, in the process of etching to a predetermined height, a sensor is used to obtain dimensions of the capacitor holes in the top pattern of the remaining capacitor support structure in real time until the capacitor support structure is etched to the predetermined height, and then the dimensional variation of each capacitor hole is obtained.

In step 608, a third determination standard is obtained.

Specifically, according to the predetermined yield, a third test relationship corresponding to the predetermined yield is obtained; and according to the third test relationship, a third determination standard for the dimensional variation after the set height of the capacitor support structure is removed.

Specifically, the predetermined yield refers to a required yield of wafers corresponding to the semiconductor structure, and according to the predetermined yield and the set height, the corresponding dimensional variation is obtained as the third determination standard.

In this case, step 605 further includes: according to the dimensional variation and the third determination standard, determining whether the semiconductor structure is a normal etching state.

Specifically, it is determined whether an actual dimensional variation of the semiconductor structure is within a range of the third determination standard. If the actual dimensional variation of the semiconductor structure is less than or equal to the third determination standard, it indicates that the semiconductor structure is in a normal etching state. If the actual dimensional variation of the semiconductor structure is greater than the third determination standard, it indicates that the semiconductor structure is in an abnormal etching state.

In an example, after step 608 and before step 605, the detection method further includes: obtaining a third test relationship of the semiconductor structure corresponding to products with different yields; and according to the third test relationship at different yields, establishing a fourth test relationship among the height of the removed capacitor support structure, the dimensional variation, and the yield.

The process of according to the third test relationship, obtaining the third determination standard for the dimensional variation when the set height of the capacitor support structure is removed includes: according to a predetermined yield range, obtaining the fourth test relationship corresponding to the predetermined yield range; and according to the fourth test relationship, obtaining a dimensional variation and a fourth determination standard after the set height of the capacitor support structure is removed.

Specifically, the yield range refers to the yield of the semiconductor structure in a normal working state confirmed according to an actual application; the dimensional variation corresponding to the yield range is obtained, and a range of the dimensional variation is used as the fourth determination standard.

The process of according to the offset distance and the third determination standard, determining whether the semiconductor structure is in a normal etching state includes: according to the offset distance and the fourth determination standard, determining whether the semiconductor structure is in a normal etching state.

Specifically, it is determined whether an actual dimensional variation of the semiconductor structure is within a range of the fourth determination standard. If the actual dimensional variation of the semiconductor structure reaches the fourth determination standard, it indicates that the semiconductor structure is in a normal etching state. If the actual dimensional variation of the semiconductor structure does not reach the fourth determination standard, it indicates that the semiconductor structure is in an abnormal etching state.

It should be noted that, in this embodiment, a position of the capacitor hole having a maximum value of the dimensional change greater than the dimensional variation is also obtained. By obtaining the position of the capacitor hole with a large etching error, a state of an etching chamber for performing the etching process can be further evaluated, and the abnormality of the product can be quickly monitored.

Compared with the related art, the present disclosure adopts a solution that according to the test relationship obtained in the foregoing method, the yield rate of the semiconductor structure is directly obtained according to the spacing between the capacitor holes, thus quickly monitoring the abnormality of the product.

The division of the above various steps is only for clear description. In implementation, the steps can be combined into one step or some steps can be split into a plurality steps, as long as they include the same logical relationship, they are all within the protection scope of this patent. Insignificant modifications added to the process or insignificant designs introduced to the process without changing the core design of the process are all within the protection scope of this patent.

Since the foregoing embodiment and this embodiment correspond to each other, this embodiment can be implemented in cooperation with the foregoing embodiment. The related technical details mentioned in the foregoing embodiment are still valid in this embodiment, and the technical effects that can be achieved in the foregoing embodiment can also be achieved in this embodiment. In order to reduce repetition, details are not repeated here. Correspondingly, the related technical details mentioned in this embodiment can also be applied to the foregoing embodiment.

A person of ordinary skill in the art can understand that the above-mentioned embodiments are specific embodiments for implementing the present disclosure, and in practical applications, various changes can be made to the embodiments in form and details without departing from the spirit and scope of the present disclosure.

What is claimed is:

1. A method for obtaining parameters of a semiconductor structure, comprising:
   obtaining a semiconductor structure, the semiconductor structure comprising a substrate and a capacitor support structure on the substrate, the capacitor support structure having a plurality of capacitor holes therein, the capacitor holes penetrating the capacitor support structure in a thickness direction of the capacitor support structure;
   removing the capacitor support structure with partial height;
   obtaining a test pattern, the test pattern being a pattern exposed at a top of the remaining capacitor support structure; and determining a measurement interval in the test pattern, wherein the measurement interval comprising the capacitor holes in M rows and N columns, M and N being natural numbers greater than or equal to 2;

obtaining a plurality of spacings in a predetermined direction, wherein each spacing is a distance between the capacitor holes at predetermined positions in the measurement interval;

obtaining an offset range according to maximum and minimum ones of the plurality of spacings in a single row/column in the predetermined direction, the offset range indicating a distance between the maximum and minimum ones of the plurality of spacings; and obtaining an offset distance, wherein the offset distance is an average of the plurality of offset ranges.

2. The method for obtaining parameters of a semiconductor structure according to claim 1, before the removing the capacitor support structure with the partial height, further comprising
the following step:
forming a protective layer on sidewalls of the capacitor hole.

3. The method for obtaining parameters of a semiconductor structure according to claim 2, wherein
the step of the forming the protective layer on sidewalls of the capacitor hole comprises:
forming a protective film covering both a top surface of the capacitor support structure and the sidewalls of the capacitor hole; and
removing the protective film on the surface of the capacitor support structure to form the protective layer on the sidewalls of the capacitor hole.

4. The method for obtaining parameters of a semiconductor structure according to claim 1, wherein
during removing the capacitor support structure with the partial height, the method further comprises:
obtaining a dimensional variation of the plurality of capacitor holes in the pattern exposed at the top of the capacitor support structure, the dimensional variation being used to represent a value of a dimensional change in the plurality of capacitor holes in the process of removing the capacitor support structure with the partial height.

5. The method for obtaining parameters of a semiconductor structure according to claim 4, wherein
the step of the obtaining the dimensional variation of the plurality of capacitor holes in the pattern exposed at the top of the capacitor support structure comprises:
according to a dimension of each capacitor hole in the semiconductor structure, obtaining a maximum value of a dimensional change in each capacitor hole in the process of removing the capacitor support structure with the partial height; and
according to the maximum value of the dimensional change in the capacitor hole, obtaining the dimensional variation,
wherein the dimensional variation is an average of the multiple maximum values of the dimension change in the capacitor holes.

6. A method for obtaining a detection standard, according to the method for obtaining parameters of the semiconductor structure according to claim 1, further comprising:
obtaining a yield of a products corresponding to the semiconductor structure; and
obtaining a first test relationship between the partial height which is a height of the capacitor support structure removed from the semiconductor structure and the offset distance under the yield.

7. The method for obtaining a detection standard according to claim 6, further comprising:
obtaining a plurality of yields of products corresponding to different semiconductor structures, and obtaining the first test relationship under different yields; and
according to the first test relationship under different yields, establishing a second test relationship among the partial height, the offset distance, and the yield.

8. The method for obtaining a detection standard according to claim 6, wherein
during removing the capacitor support structure with the partial height, the method further comprises:
obtaining a dimensional variation of the plurality of capacitor holes in the pattern exposed at the top of the capacitor support structure, the dimensional variation being used to represent a value of a dimensional change in the capacitor hole in the process of removing the capacitor support structure with the partial height; and
obtaining a third test relationship between the partial height and the dimensional variation under the yield.

9. The method for obtaining a detection standard according to claim 8, comprising:
obtaining a plurality of yields of products corresponding to different semiconductor structures, and obtaining the third test relationship under different yields; and
according to the third test relationship under different yields, establishing a fourth test relationship among the partial height, the dimensional variation, and the yield.

10. The method for obtaining parameters of a semiconductor structure according to claim 1, wherein,
the predetermined direction refers to a direction of the row;
or,
the predetermined direction refers to a direction of the column;
or,
the predetermined direction refers to a direction of the row and a direction of the column.

11. The method for obtaining parameters of a semiconductor structure according to claim 1, wherein,
the distance between the capacitor holes at predetermined positions refers to a distance between adjacent capacitor holes, or a distance between three capacitor holes, or a distance between four capacitor holes, and the like.

12. A detection method, comprising:
obtaining a semiconductor structure, the semiconductor structure comprising a substrate and a capacitor support structure on the substrate, the capacitor support structure having a plurality of capacitor holes therein, the capacitor holes penetrating the capacitor support structure in a thickness direction of the capacitor support structure;
obtaining a set height and removing the capacitor support structure with the set height;
obtaining a test pattern, the test pattern being a pattern exposed at a top of the remaining capacitor support structure; and
determining a measurement interval in the test pattern, wherein the measurement interval comprising the capacitor holes in M rows and N columns, M and N being natural numbers greater than or equal to 2;
obtaining a plurality of spacings in a predetermined direction, wherein each spacing is a distance between the capacitor holes at predetermined positions in the measurement interval;

obtaining an offset range according to maximum and minimum ones of the plurality of spacings in a single row/column in the predetermined direction, the offset range indicating a distance between the maximum and minimum ones of the plurality of spacings; and obtaining an offset distance, wherein the offset distance is an average of the plurality of offset ranges;

obtaining a yield of a products corresponding to the semiconductor structure; and obtaining a first test relationship between the partial height which is a height of the capacitor support structure removed from the semiconductor structure and the offset distance under the yield;

according to the first test relationship, obtaining a first determination standard, wherein the first determination standard refers to a standard offset distance corresponding to the predetermined yield and the set height under the first test relationship; and according to the actual offset distance and the first determination standard, determining whether the semiconductor structure is in a normal etching state.

13. The detection method according to claim 12, further comprising:

obtaining a plurality of yields of products corresponding to different semiconductor structures, and obtaining the first test relationship under different yields;

and according to the first test relationship under different yields, establishing a second test relationship among the partial height, the offset distance, and the yield;

providing a predetermined yield range and according to the predetermined yield range, obtaining the second test relationship corresponding to the predetermined yield range; and according to the second test relationship, obtaining a second determination standard, wherein the second determination standard refers to a standard offset distance range corresponding to predetermined yield range and the set height under the second test relationship;

according to the actual offset distance and the second determination standard, determining whether the semiconductor structure is in a normal etching state.

14. The detection method according to claim 12, wherein the set height is of multiple height values, the detection method further comprising:

sorting the height values; and in an order from smallest to largest, obtaining the etching state of the semiconductor structure at each set height.

15. The detection method according to claim 12, wherein during removing the capacitor support structure with the set height, further comprises:

obtaining an actual dimensional variation of the plurality of capacitor holes in a pattern exposed at the top of the capacitor support structure;

and the method further comprises:

according to the predetermined yield, obtaining a third test relationship corresponding to the predetermined yield;

according to the third test relationship, obtaining a third determination standard, wherein the third determination standard refers to a standard dimensional variation corresponding to the predetermined yield and the set height under the third test relationship; and according to the actual dimensional variation and the third determination standard, determining whether the semiconductor structure is in a normal etching state.

16. The detection method according to claim 15, further comprising:

obtaining a plurality of yields of products corresponding to different semiconductor structures, and obtaining the third test relationship under different yields;

and according to the third test relationship under different yields, establishing a fourth test relationship among the partial height, the dimensional variation, and the yield;

providing a predetermined yield range and according to the predetermined yield range, obtaining the fourth test relationship corresponding to the predetermined yield range; and according to the fourth test relationship, obtaining a fourth determination standard, wherein the fourth determination standard refers to a standard dimensional variation range corresponding to predetermined yield range and the set height under the fourth test relationship;

according to the actual dimensional variation and the fourth determination standard, determining whether the semiconductor structure is in a normal etching state.

17. The detection method according to claim 15, wherein the step of obtaining the actual dimensional variation of the capacitor hole in the pattern exposed at the top of the capacitor support structure comprises:

obtaining a maximum value of a dimensional change in each capacitor hole; and according to the maximum value of the dimensional change in the capacitor hole, obtaining the dimensional variation.

18. The detection method according to claim 16, further comprising:

obtaining a position of the capacitor hole having a maximum value of the dimensional change greater than the dimensional variation.

* * * * *